US012600909B2

(12) United States Patent
Nagao et al.

(10) Patent No.: US 12,600,909 B2
(45) Date of Patent: Apr. 14, 2026

(54) ETCHING SOLUTION COMPOSITION

(71) Applicant: RASA INDUSTRIES, LTD., Tokyo (JP)

(72) Inventors: Sho Nagao, Tokyo (JP); Tomohiro Inoue, Tokyo (JP); Takao Mitsui, Tokyo (JP); Nobuhiro Oshita, Tokyo (JP); Reiji Uchida, Tokyo (JP)

(73) Assignee: RASA INDUSTRIES, LTD., Tokyo (JP)

( * ) Notice: Subject to any disclaimer, the term of this patent is extended or adjusted under 35 U.S.C. 154(b) by 222 days.

(21) Appl. No.: 18/569,249

(22) PCT Filed: Mar. 30, 2022

(86) PCT No.: PCT/JP2022/015849
§ 371 (c)(1),
(2) Date: Dec. 12, 2023

(87) PCT Pub. No.: WO2022/264631
PCT Pub. Date: Dec. 22, 2022

(65) Prior Publication Data
US 2024/0279548 A1     Aug. 22, 2024

(30) Foreign Application Priority Data
Jun. 14, 2021     (JP) ................................. 2021-098603

(51) Int. Cl.
| | |
|---|---|
| *C09K 13/06* | (2006.01) |
| *C09K 13/00* | (2006.01) |
| *C09K 13/04* | (2006.01) |
| *H10P 50/00* | (2026.01) |
| *H10P 50/28* | (2026.01) |
| *H10P 50/64* | (2026.01) |
| *H10P 50/66* | (2026.01) |

(52) U.S. Cl.
CPC .............. *C09K 13/06* (2013.01); *C09K 13/00* (2013.01); *C09K 13/04* (2013.01); *H10P 50/00* (2026.01); *H10P 50/28* (2026.01); *H10P 50/282* (2026.01); *H10P 50/283* (2026.01); *H10P 50/642* (2026.01); *H10P 50/667* (2026.01); *H10P 50/691* (2026.01)

(58) Field of Classification Search
None
See application file for complete search history.

(56) References Cited

U.S. PATENT DOCUMENTS

| | | | |
|---|---|---|---|
| 8,778,210 | B2 | 7/2014 | Cooper et al. |
| 9,158,203 | B2 | 10/2015 | Cooper et al. |
| 9,691,629 | B2 | 6/2017 | Cooper et al. |
| 2010/0176082 | A1 | 7/2010 | Cooper et al. |
| 2016/0035580 | A1 | 2/2016 | Cooper et al. |
| 2018/0346811 | A1 | 12/2018 | Lee et al. |
| 2019/0074188 | A1 | 3/2019 | Cooper et al. |
| 2019/0122906 | A1 | 4/2019 | Zhang et al. |
| 2019/0136090 | A1 | 5/2019 | Park et al. |
| 2021/0054287 | A1* | 2/2021 | White ................... C09K 13/08 |

FOREIGN PATENT DOCUMENTS

| | | | |
|---|---|---|---|
| JP | 2018-207108 | A | 12/2018 |
| JP | 2019-080049 | A | 5/2019 |
| JP | 2020-503664 | A | 1/2020 |
| JP | 2020-096160 | A | 6/2020 |
| JP | 2020-533786 | A | 11/2020 |
| KR | 10-2018-0010483 | A | 1/2018 |
| SG | 11202101593 | Y | 3/2021 |
| TW | 201612978 | A | 4/2016 |

OTHER PUBLICATIONS

International Search Report issued in Patent Application No. PCT/JP2022/015849 dated Jun. 21, 2022.
Taiwanese Office Action issued in Taiwanese Patent Application No. 111112632 dated Apr. 14, 2023.

* cited by examiner

*Primary Examiner* — Jiong-Ping Lu
(74) *Attorney, Agent, or Firm* — McDonald Hopkins LLC

(57) ABSTRACT

Provided is an etching solution composition that can have both a higher etch selectivity of silicon nitride and a reduction in the deposition of silica on the surface of silicon oxide. An inorganic acid-based etching solution composition for selectively etching away silicon nitride from a semiconductor containing silicon nitride and silicon oxide, the etching solution composition comprising: (a) an etch inhibitor that reduces etching of silicon oxide; and (b) a deposition inhibitor that reduces deposition of silica on a surface of silicon oxide.

7 Claims, No Drawings

ETCHING SOLUTION COMPOSITION

TECHNICAL FIELD

The present invention relates to an inorganic acid-based etching solution composition for selectively etching away silicon nitride from a semiconductor containing silicon nitride and silicon oxide.

BACKGROUND ART

The recent increase in the density and capacity of semiconductor circuits has led to a demand for finer etching technology. For example, in fabrication of NAND flash memory (3D NAND) having a three-dimensional structure, a silicon nitride film and a silicon oxide film are alternately layered, and the resultant structure is subjected to an etching process, i.e., is immersed in an etching solution. At that time, it is necessary to precisely remove only the silicon nitride film. To this end, a variety of etching solutions (compositions) have been developed so far in order to achieve a high etch selectivity in the etching process.

For example, Patent Document 1 describes an etching solution composition that is used in a fabrication process of a three-dimensional semiconductor, and that is a mixture of a solution containing silica and an alkali, phosphoric acid, and water. Patent Document 1 indicates that by using such an etching solution composition, the etching of the silicon oxide film is reduced, so that the etch selectivity of the silicon nitride film is improved (see paragraph [0013] in the description of Patent Document 1).

As another technique, Patent Document 2 describes an etching solution composition that is a mixture of water, phosphoric acid, and a hydroxyl group-containing solvent. Patent Document 2 indicates that examples of the hydroxyl group-containing solvent include polyols, glycols, and monovalent alcohols, and these components serve to protect the silicon oxide film, so that the silicon nitride film is etched with higher priority and selectively (see paragraph [0025] in the description of Patent Document 2).

CITATION LIST

Patent Literature

Patent Document 1: Japanese Unexamined Patent Application Publication No. 2020-96160
Patent Document 2: Japanese Unexamined Patent Application Publication No. 2018-207108

SUMMARY OF INVENTION

Technical Problem

Incidentally, when silicon nitride is etched using an etching solution composition containing phosphoric acid and water, ammonium phosphate [$(NH_4)_3PO_4$] and silicic acid [$SiO_x(OH)_{4-2x}]_n$ are generated in the solution. As the silicic acid concentration of the solution increases, silicic acid molecules undergo dehydration condensation to form silica [$SiO_x$], which is likely to be deposited on the surface of silicon oxide. Such deposition may cause defects such as short circuits and defective interconnections in semiconductor products, and therefore, should be avoided to the extent possible.

In addition, in order to selectively etch away silicon nitride from a semiconductor containing silicon nitride and silicon oxide, it is necessary to increase the etch rate of silicon nitride and decrease the etch rate of silicon oxide. However, silicon oxide is also etched by water, and therefore, when an aqueous etching solution composition is used, it is necessary to take measures to reduce the etching of silicon oxide.

With regard to this, Patent Document 1 includes the wording "the etching of the silicon oxide film is reduced, so that the etch selectivity of the silicon nitride film is improved," but indicates that the mechanism of the effect has not been clarified (see paragraph [0013] in the description of Patent Document 1). In addition, the etching solution composition described in Patent Document 1 originally contains silicic acid, and therefore, it is considered that when silicon nitride is etched, the silicic acid concentration of the solution increases, so that silicic acid is more likely to be deposited in the form of silica on the surface of silicon oxide.

Patent Document 2 indicates that the etching solution composition protects the silicon oxide film with the hydroxyl group-containing solvent. However, the etch selectivity of silicon nitride of the etching solution composition itself is not sufficiently high. Data described in Patent Document 2 shows that the highest ratio of etch rates (selectivity ratio) in silicon nitride and silicon oxide is as low as 137 (see FIGS. 2, 4, and 6 in Patent Document 2). In addition, although in Patent Document 2 it is recognized that water contained in the etching solution composition serves as a solvent, residue remover, viscosity modifier, and diluent (see paragraph [0021] in Patent Document 2), the effect of etching silicon oxide by water is not recognized or taken into account.

Thus, conventional etching solution compositions have difficulties in reducing the deposition of silica on the surface of silicon oxide while increasing the etch rate of silicon nitride. There is still room for improvement in etching solution compositions.

With the above problems in mind, the present invention has been made. It is an object of the present invention to provide an etching solution composition that is capable of providing both a higher etch selectivity of silicon nitride and a reduction in the deposition of silica on the surface of silicon oxide.

Solution to Problem

A characteristic feature of an etching solution composition according to the present invention for solving the above problem is an inorganic acid-based etching solution composition for selectively etching away silicon nitride from a semiconductor containing silicon nitride and silicon oxide, the etching solution composition comprising:
  (a) an etch inhibitor that reduces etching of silicon oxide; and
  (b) a deposition inhibitor that reduces deposition of silica on a surface of silicon oxide.

With the etching solution composition thus configured, silicon nitride is mainly etched by the inorganic acid while the etch inhibitor reduces the etching of silicon oxide by water, resulting in an improvement in the etch selectivity of silicon nitride in the semiconductor containing silicon nitride and silicon oxide. In addition, the deposition inhibitor can reduce the deposition of silica on the surface of silicon oxide, resulting in a reduction in the occurrence of defects such as short circuits and defective interconnections in semiconductor products.

In the etching solution composition of the present invention, the etch inhibitor preferably contains an alkoxysilane or a silane coupling agent, and the deposition inhibitor preferably contains a hydrazide.

The etching solution composition thus configured contains a preferable etch inhibitor and deposition inhibitor, and therefore, can have both the effect of reducing the etching of silicon oxide by the etch inhibitor and the effect of reducing the deposition of silica on the surface of silicon oxide by the deposition inhibitor, resulting in an improvement in the etch selectivity of silicon nitride.

In the etching solution composition of the present invention, the alkoxysilane preferably includes dimethyldimethoxysilane, and the silane coupling agent preferably includes N-2-(aminoethyl)-3-aminopropyltrimethoxysilane or 3-aminopropyltrimethoxysilane.

The etching solution composition thus configured contains a particularly preferable compound as the etch inhibitor, resulting in an excellent effect of reducing the etching of silicon oxide.

In the etching solution composition of the present invention, the hydrazide preferably includes adipic acid dihydrazide, acetohydrazide, succinic acid dihydrazide, or dodecanedioic acid dihydrazide.

The etching solution composition thus configured contains a particularly preferable compound as the deposition inhibitor, resulting in an excellent effect of reducing the deposition of silica on the surface of silicon oxide.

In the etching solution composition of the present invention, the deposition inhibitor preferably further includes a compound having an imidazole backbone, a compound having a pyrrolidine backbone, a phosphonic acid compound, or a compound having a quaternary ammonium backbone.

With the etching solution composition thus configured, the deposition inhibitor contains a second deposition inhibitor in addition to the hydrazide, and therefore, can maintain the etch selectivity of silicon nitride and reduce a decrease in the silicon nitride etch rate even when the solution is consumed for etching and becomes less effective, which contributes to a greater longevity of the etching solution composition and the reduction of the etching process time.

In the etching solution composition of the present invention, the compound having an imidazole backbone preferably includes imidazole, 1-butyl-3-methylimidazolium chloride, 1-ethyl-3-methylimidazolium hexafluorophosphate, or 1-ethyl-3-octylimidazolium tetrafluoroborate, the compound having a pyrrolidine backbone preferably includes 1-butyl-1-methylpyrrolidinium hexafluorophosphate or 1-butyl-1-methylpyrrolidinium tetrafluoroborate, the phosphonic acid compound preferably includes tetrabutylphosphonium bromide, and the compound having a quaternary ammonium backbone preferably includes tetramethylammonium hexafluorophosphate.

The etching solution composition thus configured contains a particularly preferable compound as the second deposition inhibitor, which contributes to a greater longevity of the etching solution composition and the reduction of the etching process time.

In the etching solution composition of the present invention, it is preferable that the etching solution composition can be used until the concentration of Si derived from silicon nitride in the solution reaches 1000 ppm.

The etching solution composition thus configured can be used until the concentration of Si derived from silicon nitride in the solution reaches 1000 ppm. Therefore, the life of the solution is significantly extended compared to the life of conventional etching solutions (phosphoric acid), and the amount of the etching process is increased with a smaller amount of the solution, resulting in a significant cost reduction and excellent environmental friendliness. In addition, the etch inhibitor contained in the etching solution composition reduces the etching of the silicon oxide film, resulting in a higher etch selectivity of silicon nitride.

In the etching solution composition of the present invention, a selectivity ratio $[R_1/R_2]$ of a silicon nitride etch rate $[R_1]$ to a silicon oxide etch rate $[R_2]$ is preferably at least two times as high as that of an etching solution containing only the inorganic acid.

With the etching solution composition thus configured, the selectivity ratio $[R_1/R_2]$ is at least two times as high as the selectivity ratio of an etching solution containing only the inorganic acid. Therefore, the the etching solution composition can have both a high etch selectivity of silicon nitride and a reduction in the deposition of silica on the surface of silicon oxide, and can also allow a quicker etching process.

DESCRIPTION OF EMBODIMENTS

Embodiments of an etching solution composition according to the present invention will be described. It should be noted that the present invention is in no way intended to be limited to the embodiments described below.

[Etching Solution Composition]

The etching solution composition of the present invention is used to selectively etch away silicon nitride from a semiconductor containing silicon nitride and silicon oxide. Components contained in the etching solution composition will be described below.

<Inorganic Acid>

The etching solution composition of the present invention is based on an inorganic acid. Examples of the inorganic acid include phosphoric acid, sulfuric acid, nitric acid, hydrochloric acid, and mixed acids of these inorganic acids. Of these inorganic acids, phosphoric acid is preferable. Phosphoric acid is used in the form of an aqueous solution when diluted in use, and the concentration thereof is preferably 50 to 100 wt %, more preferably 85 to 95 wt %. It should be noted that the etching solution composition is used with the phosphoric acid thereof adjusted to the above concentration. For example, the above appropriate concentration can be obtained by concentrating a stock solution containing a low-concentration aqueous phosphoric acid solution during or before use, by diluting a stock solution having a phosphoric acid concentration of more than 100 wt % (polyphosphoric acid) with water during or before use, or by dissolving phosphoric anhydride $(P_2O_5)$ in water during or before use.

<Etch Inhibitor>

The etching solution composition of the present invention contains an etch inhibitor that reduces the etching of silicon oxide. The amount of the etch inhibitor contained in the etching solution composition is preferably 0.01 to 10 wt %, more preferably 0.1 to 1 wt %. As the etch inhibitor, organic silicon compounds such as alkoxysilanes and silane coupling agents are preferably used.

[Alkoxysilanes]

Examples of the alkoxysilanes include methyltrimethoxysilane, dimethyldimethoxysilane, phenyltrimethoxysilane, dimethoxydiphenylsilane, tetraethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, and 1,6-bis(trimethoxysilyl)hexane. These alkoxysilanes may be used alone or in a mixture of two or more thereof.

[Silane Coupling Agents]

Examples of the silane coupling agents include vinyltrimethoxysilane, 3-glycidoxypropylmethyldimethoxysilane, 3-glycidoxypropyltrimethoxysilane, p-styryltrimethoxysilane, 3-methacryloxypropyltrimethoxysilane, 3-acryloxypropyltrimethoxysilane, N-2-(aminoethyl)-3-aminopropyltrimethoxysilane, N-2-(aminoethyl)-4-aminobutyltrimethoxysilane, N-2-(aminoethyl)-5-aminopentyltrimethoxysilane, N-2-(aminoethyl)-6-aminohexyltrimethoxysilane, N-2-(aminoethyl)-3-aminopropylmethyldimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, hydrochlorides of the above aminosilanes, tris-(trimethoxysilylpropyl)isocyanurate, 3-mercaptopropylmethyldimethoxysilane, 3-isocyanatepropyltriethoxysilane, and 3-trimethoxysilylpropylsuccinic anhydride. Of these silane coupling agents, N-2-(aminoethyl)-3-aminopropyltrimethoxysilane, N-2-(aminoethyl)-4-aminobutyltrimethoxysilane, N-2-(aminoethyl)-5-aminopentyltrimethoxysilane, N-2-(aminoethyl)-6-aminohexyltrimethoxysilane, N-2-(aminoethyl)-3-aminopropylmethyldimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane are preferable, and N-2-(aminoethyl)-3-aminopropyltrimethoxysilane, N-2-(aminoethyl)-4-aminobutyltrimethoxysilane, N-2-(aminoethyl)-5-aminopentyltrimethoxysilane, N-2-(aminoethyl)-6-aminohexyltrimethoxysilane, and 3-aminopropyltrimethoxysilane are more preferable. These silane coupling agents may be used alone or in a mixture of two or more thereof.

[Other Organic Silicon Compounds]

As the organic silicon compound, silazanes and siloxanes may be used in addition to the above alkoxysilanes and silane coupling agents.

<Deposition Inhibitor>

The etching solution composition of the present invention contains a deposition inhibitor that reduces the deposition of silica on the surface of silicon oxide. The amount of the deposition inhibitor contained in the etching solution composition is preferably 0.01 to 5 wt %, more preferably 0.1 to 1 wt %. As the deposition inhibitor, hydrazine compounds, pyrazoles, triazoles, hydrazides, compounds having an imidazole backbone, compounds having a pyrrolidine backbone, compounds having a piperidine backbone, compounds having a morpholine backbone, compounds having a pyridine backbone, phosphonic acid compounds, compounds having a quaternary ammonium backbone, compounds having a pyrimidine backbone, compounds having a purine backbone, compound having a urea backbone, and the like are preferably used. The above compounds and substances may be used alone or in a mixture of two or more thereof. In particular, when two different deposition inhibitors (a first deposition inhibitor and a second deposition inhibitor) are used, the etching solution composition is considerably useful in terms of not only the performance in the etching process but also the longer life and cost reduction of the solution.

[Hydrazine Compounds]

Examples of the hydrazine compounds include hydrazine, butylhydrazine, isopropylhydrazine, benzylhydrazine, N,N-dimethylhydrazine, 1,2-diacetylhydrazine, phenylhydrazine, N,N-dicarbamoylhydrazine, hydrazine sulfate, hydrazine monohydrochloride, hydrazine dihydrochloride, butylhydrazine hydrochlorides, hydrazine carbonate, and hydrazine monohydrobromide. These hydrazine compounds may be used alone or in a mixture of two or more thereof.

[Pyrazoles]

Examples of the pyrazoles include 3,5-dimethylpyrazole and 3-methyl-5pyrazon. These pyrazoles may be used alone or in a mixture of two or more thereof.

[Triazoles]

Examples of the triazoles include 4-amino-1,2,4-triazole, 1,2,4-triazole, 1,2,3-triazole, 1-hydroxybenzotriazole, and 3-mercapto-1,2,4-triazole. These triazoles may be used alone or in a mixture of two or more thereof.

[Hydrazides]

Examples of the hydrazides include propionic acid hydrazide, laurylic acid hydrazide, salicylic acid hydrazide, formohydrazide, acetohydrazide, p-hydroxybenzoic acid hydrazide, naphthoic acid hydrazide, 3-hydroxy-2-naphthoic acid hydrazide, benzhydrazide, carbodihydrazide, oxalic acid dihydrazide, malonic acid dihydrazide, succinic acid dihydrazide, glutaric acid dihydrazide, adipic acid dihydrazide, azelaic acid dihydrazide, sebacic acid dihydrazide, dodecanedioic acid dihydrazide, maleic acid dihydrazide, fumaric acid dihydrazide, tartaric acid dihydrazide, malic acid dihydrazide, diglycolic acid dihydrazide, isophthalic acid dihydrazide, terephthalic acid dihydrazide, 2,6-naphthalenedicarboxylic acid dihydrazide, 2,6-naphthoic acid dihydrazide, citric acid trihydrazide, pyromellitic acid trihydrazide, 1,2,4-benzenetricarboxylic acid trihydrazide, nitrilotriacetic acid trihydrazide, 1,3,5-cyclohexanetricarboxylic acid trihydrazide, ethylenediaminetetraacetic acid tetrahydrazide, and 1,4,5,8-naphthoic acid tetrahydrazide. Of these hydrazides, adipic acid dihydrazide is preferable. These hydrazides may be used alone or in a mixture of two or more thereof.

[Compounds Having an Imidazole Backbone]

Examples of the compounds having an imidazole backbone include compounds such as imidazole, imidazolecarboxylic acid, imidurea, diazolidinyl urea, 3-(2-oxoimidazolidin-1-yl)benzate, and imidazolehydrochlorides, and imidazolium salts such as 1-ethyl-3-methylimidazolium chloride, 1-butyl-3-methylimidazolium chloride, 1,3-dimethylimidazoliummethyl sulfate, 1-ethyl-3-methylimidazolium acetate, 1-ethyl-3-octylimidazolium tetrafluoroborate, 1,3-dimethylimidazolium dimethylphosphate, 1-ethyl-3-methylimidazolium tetrafluoroborate, and 1-ethyl-3-methylimidazolium hexafluorophosphate. These compounds having an imidazole backbone may be used alone or in a mixture of two or more thereof.

[Compounds Having a Pyrrolidine Backbone]

Examples of the compounds having a pyrrolidine backbone include compounds such as pyrrolidine, 2-pyrrolidone, N-methylpyrrolidone, N-vinyl-2-pyrrolidone, pyroglutamic acid, and piracetam, and pyrrolidinium salts such as 1-ethyl- 1-methylpyrrolidinium chloride, 1-butyl-1-methylpyrrolidinium chloride, 1-ethyl-1-methylpyrrolidinium acetate, 1-ethyl-1-methylpyrrolidinium tetrafluoroborate, 1-butyl-1-methylpyrrolidinium tetrafluoroborate, 1-ethyl-1-methylpyrrolidinium hexafluorophosphate, and 1-butyl-1-methylpyrrolidinium hexafluorophosphate. These compounds having a pyrrolidine backbone may be used alone or in a mixture of two or more thereof.

[Compounds Having a Piperidine Backbone]

Examples of the compounds having a piperidine backbone include compounds such as piperidine, ethylpiperidine-4-carboxylate, piperidin-2-ylacetate, and methylpiperidine-4-carboxamide, and piperidinium salts such as (piperidinium-1-ylmethyl)trifluoroborate, 1-butyl-1-methylpiperidinium bromide, and 1-butyl-1-methylpiperidinium bisimide. These compounds having a piperidine backbone may be used alone or in a mixture of two or more thereof.

[Compounds Having a Morpholine Backbone]

Examples of the compounds having a morpholine backbone include compounds such as morpholine, morpholin-2-ylmethanol, morpholin-3-one, morpholine-4-carbothioic acid amide, morpholin-4-ylacetate, and morpholine-4-ylethylacetate, and morpholinium salts such as 4-ethyl-4-methylmorpholinium bromide, and 4-(2-ethoxyethyl)-4-methylmorpholinium bisimide. The compounds having a morpholine backbone may be used alone or in a mixture of two or more thereof.

[Compounds Having a Pyridine Backbone]

Examples of the compounds having a pyridine backbone include compounds such as pyridine, N,N-dimethyl-4-aminopyridine, bipyridine, 2,6-lutidine, and pyridinium p-toluenesulfonate, and pyridinium salts such as 1-butyl-3-methylpyridinium chloride, 1-butylpyridinium tetrafluoroborate, and 1-butyl-pyridinium hexafluorophosphate. These compounds having a pyridine backbone may be used alone or in a mixture of two or more thereof.

[Phosphonic Acid Compounds]

Examples of the phosphonic acid compounds such as phosphonic acid, diphenyl phosphonate, butyl phosphonate, dipentyl phosphonate, and ammonium phosphate, and phosphonium salts such as tetrabutylphosphonium hexafluorophosphate, tetrabutylphosphonium bisimide, and tetrabutylphosphonium bromide. These phosphonic acid compounds may be used alone or in a mixture of two or more thereof.

[Compounds Having a Quaternary Ammonium Backbone]

Examples of the compounds having a quaternary ammonium backbone include tetramethylammonium chloride, tetrabutylammonium chloride, tetramethylammonium bromide, tetramethylammonium hydroxide, tetramethylammonium iodide, tetrabutylammonium bromide, tetrabutylammonium hydrogen sulfate, tetramethylammonium hexafluorophosphate, tetrabutylammonium hexafluorophosphate, and choline acetate. These compounds having a quaternary ammonium backbone may be used alone or in a mixture of two or more thereof.

[Compounds Having a Pyrimidine Backbone]

Examples of the compounds having a pyrimidine backbone include thymine, cytosine, uracil, and nucleosides, ribonucleosides, and deoxyribonucleosides thereof. These compounds having a pyrimidine backbone may be used alone or in a mixture of two or more thereof.

[Compounds Having a Purine Backbone]

Examples of the compounds having a purine backbone include purine, adenine, guanine, uric acid, caffeine, hypoxanthine, xanthine, theophylline, theobromine, isoguanine, and nucleosides, ribonucleotides, and deoxyribonucleotides thereof. These compounds having a purine backbone may be used alone or in a mixture of two or more thereof.

[Compounds Having a Urea Backbone]

Examples of the compounds having a urea backbone include urea, hydroxyurea, N,N-diethylthiourea, N,N-dibutylthiourea, biurea, biuret, and N-amidinothiourea. These compounds having a urea backbone may be used alone or in a mixture of two or more thereof.

[Formulation of Etching Solution Composition]

The etching solution composition of the present invention is formulated by adding an etch inhibitor and a deposition inhibitor to an inorganic acid as the base thereof. Here, the etch inhibitor and the deposition inhibitor can be directly added to the inorganic acid. Alternatively, the etch inhibitor and the deposition inhibitor may be dissolved or suspended in a solvent, which is then added to the inorganic acid. The etch inhibitor and the deposition inhibitor may be added to the inorganic acid at room temperature or while the solution is being heated.

<Solvent>

Examples of the solvent for dissolving or suspending the etch inhibitor and the deposition inhibitor include water, alcohols such as methanol, ethanol, 2-propanol, butanol, octanol, benzyl alcohol, ethylene glycol, propylene glycol, diethylene glycol, triethylene glycol, and 2,2,2-trifluoroethanol, ethers such as diethyl ether, diisopropyl ether, dibutyl ether, cyclopentylmethyl ether (CPME), tetrahydrofuran (THF), 2-methyltetrahydrofuran, 1,4-dioxane, and dimethoxy ethane, carbonic acid esters such as ethylene carbonate, propylene carbonate, dimethyl carbonate, diethyl carbonate, ethylmethyl carbonate, and 4-fluoroethylenecarbonate, esters such as methyl formate, ethyl formate, propyl formate, methyl acetate, ethyl acetate, butyl acetate, methyl propionate, ethyl propionate, methyl butyrate, and γ-lactone, nitriles such as acetonitrile, propionitrile, valeronitrile, glutaronitrile, adiponitrile, methoxyacetonitrile, 3-methoxypropionitrile, and benzonitrile, amides such as N,N-dimethylformamide (DMF), N,N-dimethylacetamide (DMAc), and N-methylpyrrolidone (NMP), ureas such as dimethyl sulfoxide (DMSO), hexamethylphosphoric triamide (HMPA), N,N,N',N'-tetramethylurea (TMU), and N,N'-dimethylpropyleneurea (DMPU), and ionic liquids such as imidazolium salts, pyrrolidinium salts, piperidinium salts, pyridinium salts, morpholinium salts, phosphonium salts, quaternary ammonium salts, and sulfonium salts. Concerning the ionic liquids, examples of the cation include an imidazolium backbone, pyrrolidinium backbone, piperidinium backbone, morpholinium backbone, pyridinium backbone, quaternary phosphonium backbone, quaternary ammonium backbone, and sulfonium backbone, and examples of the anion include $Br^-$, $BF_4^-$, $PF_6^-$, $(CN)_2N^-$, $Cl^-$, $I^-$, $(CF_3SO_2)N^-$, $(F_2SO_2)N^-$, $CH_3COO^-$, $HSO_4^-$, $(CH_3)_2PO_4^-$, $CF_3COO^-$, $CH_3SO_3^-$, $CF_3SO_3^-$, and $SCN^-$. These solvents may be used alone or in a mixture of two or more thereof.

<Surfactant>

The etch inhibitor and the deposition inhibitor may be dissolved or suspended in the solvent in combination with a surfactant. As the surfactant, any of cationic surfactants, anionic surfactants, amphoteric surfactants, and nonionic surfactants may be used, or a combination of these surfactants may be used.

The etching solution composition of the present invention is significantly characterized in that the etching solution composition can be used when the concentration of Si derived from silicon nitride in the solution is in a predetermined concentration range or until the concentration of Si derived from silicon nitride in the solution is a predetermined concentration. For conventional etching solutions (phosphoric acid), as the period of time during which the etching solution is used or the number of times the etching solution is used increases, the concentration of Si derived from silicon nitride in the solution increases. When the Si concentration is at a certain high level, silica will be deposited. It is necessary to dispose of the solution as a less effective solution or recover and regenerate the less effective solution. In contrast, the etching solution composition of the present invention is capable of reducing the deposition of silica even when the concentration of Si derived from silicon nitride in the solution increases. As a result, the life of the solution is significantly extended compared to the life of conventional etching solutions (phosphoric acid), and the amount of the etching process is increased with a smaller amount of the solution, resulting in a significant cost reduction and excellent environmental friendliness. In addition, the etch inhibitor contained in the etching solution composition reduces the etching of the silicon oxide film, resulting in a higher etch selectivity of silicon nitride.

Here, the concentration (predetermined concentration) of Si derived from silicon nitride in the solution will be described. As described above, although the etching solution composition of the present invention can be used when the concentration of Si derived from silicon nitride in the solution is in a predetermined concentration range (i.e., the etching solution composition of the present invention can be used even when the Si concentration increased due to the etching of silicon nitride is significantly higher than in the conventional art), the component Si of the etching solution composition includes one that is derived from the silane coupling agent and the like. However, the silane coupling agent and the like maintain the stable structure in the etching solution even at any high temperature, and therefore, the component Si derived from the silane coupling agent and the like is not involved in the reduction in performance of the etching solution composition due to the deposition of silica, or the like. In addition, the component Si derived from the silicon nitride film exists in the form of silicic acid $[SiO_x(OH)_{4-2x}]_n$ in the etching solution. In this case, the above predetermined concentration is at most 1000 ppm (e.g., any concentration of 1 to 1000 ppm), i.e., the etching solution composition can be used until the concentration of Si derived from silicon nitride in the solution reaches 1000 ppm. It should be noted that the unit (ppm) of the concentration of Si derived from silicon nitride in the etching solution is herein expressed as weight by weight (mg/kg).

The etching solution composition of the present invention thus formulated can have a high etch selectivity of silicon nitride, i.e., the ratio $[R_1/R_2]$ (selectivity ratio) of the etch rate $[R_1]$ of silicon nitride to the etch rate $[R_2]$ of silicon oxide can be at least two times as high as the selectivity ratio of an etching solution containing only an inorganic acid. An etching solution composition having such a high selectivity ratio $[R_1/R_2]$ can have both a high etch selectivity of silicon nitride and a reduction in the deposition of silica on the surface of silicon oxide, and can also allow a quicker etching process. It should be noted that the ratio of the selectivity ratio $[R_1/R_2]$ of the etching solution composition of the present invention to the selectivity ratio of an etching solution containing only an inorganic acid is preferably at least six, more preferably at least nine. When an etching process is performed using an etching solution composition having such a high selectivity ratio $[R_1/R_2]$ compared to an etching solution containing only an inorganic acid, the occurrence of defects such as short circuits and defective interconnections in semiconductor products can be reduced, which is significantly beneficial to industrial production (process) of semiconductor products.

EXAMPLES

Examples of the etching solution composition of the present invention will be described. In the examples, in order to investigate the performance of the etching solution composition, an etch test was conducted using a portion of the fabrication process of a 3D NAND.

<Formulation 1 of Etching Solution Compositions>

As the etching solution composition of the present invention, etching solution compositions according to Examples 1 to 13 each containing an etch inhibitor and a deposition inhibitor were formulated. In addition, for comparison, etching solution compositions according to Comparative Examples 1 to 13 each containing only one of an etch inhibitor or a deposition inhibitor were formulated. Furthermore, for reference, an etching solution according to Reference Example 1 containing neither an etch inhibitor nor a deposition inhibitor was formulated. Methods for formulating the etching solution compositions and the etching solution will be described below.

Example 1

An aqueous phosphoric acid solution having a concentration of 85 wt % (manufactured by Rasa Industries, Ltd., hereinafter referred to as a "85% phosphoric acid" or the like) was used as an inorganic acid that serves as a base. The 85% phosphoric acid was concentrated into a 90% phosphoric acid. To the 90% phosphoric acid, 1.00 wt % of N-2-(aminoethyl)-3-aminopropyltrimethoxysilane (manufactured by Shin-Etsu Chemical Co., Ltd.) and 0.10 wt % of adipic acid dihydrazide (manufactured by Fujifilm Wako Pure Chemical Corporation) were added and dissolved to obtain an etching solution composition of Example 1.

Example 2

A predetermined amount of silicon nitride was dissolved in the etching solution composition of Example 1 so that the concentration of Si derived from silicon nitride in the solution was adjusted to 40 ppm, to obtain an etching solution composition of Example 2, which thus originally contained silicon nitride. It should be noted that the concentration of Si derived from silicon nitride in the solution was measured by a method described below in the "Method For Measuring The Concentration Of Si Derived From Silicon Nitride" section (the same applies to the following examples and comparative examples).

Example 3

A predetermined amount of silicon nitride was additionally dissolved in the etching solution composition of Example 2 so that the concentration of Si derived from silicon nitride in the solution was adjusted to 80 ppm, to obtain an etching solution composition of Example 3, which thus also originally contained silicon nitride.

Example 4

A predetermined amount of silicon nitride was additionally dissolved in the etching solution composition of Example 3 so that the concentration of Si derived from silicon nitride in the solution was adjusted to 200 ppm, to obtain an etching solution composition of Example 4, which thus also originally contained silicon nitride.

Example 5

An 85% phosphoric acid was used as an inorganic acid that serves as a base. The 85% phosphoric acid was concentrated into an 86% phosphoric acid. To the 86% phosphoric acid, 10.00 wt % of N-2-(aminoethyl)-3-aminopropyltrimethoxysilane (manufactured by Shin-Etsu Chemical Co., Ltd.) and 1.00 wt % of adipic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 1000 ppm, to obtain an etching solution composition of Example 5, which thus originally contained silicon nitride.

Example 6

To a 90% phosphoric acid prepared by a procedure similar to that of Example 1, 1.00 wt % of N-2-(aminoethyl)-3-aminopropyltrimethoxysilane (manufactured by Shin-Etsu Chemical Co., Ltd.) and 0.10 wt % of dodecanedioic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 200 ppm, to obtain an etching solution composition of Example 6, which thus originally contained silicon nitride.

Example 7

To a 90% phosphoric acid prepared by a procedure similar to that of Example 1, 1.00 wt % of dimethyldimethoxysilane (manufactured by Shin-Etsu Chemical Co., Ltd.) and 0.10 wt % of adipic acid dihydrazide (manufactured by Fujifilm Wako Pure Chemical Corporation) were added and dissolved to obtain an etching solution composition of Example 7.

Example 8

A predetermined amount of silicon nitride was additionally dissolved in the etching solution composition of Example 7 so that the concentration of Si derived from silicon nitride in the solution was adjusted to 180 ppm, to obtain an etching solution composition of Example 8, which thus also originally contained silicon nitride.

Example 9

To a 90% phosphoric acid prepared by a procedure similar to that of Example 1, 1.00 wt % of 3-aminopropyltrimethoxysilane (manufactured by Shin-Etsu Chemical Co., Ltd.) and 0.10 wt % of adipic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 200 ppm, to obtain an etching solution composition of Example 9, which thus originally contained silicon nitride.

Example 10

To a 90% phosphoric acid prepared by a procedure similar to that of Example 1, 1.00 wt % of 3-aminopropyltrimethoxysilane (manufactured by Shin-Etsu Chemical Co., Ltd.) and 1.00 wt % of acetohydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 400 ppm, to obtain an etching solution composition of Example 10, which thus originally contained silicon nitride.

Example 11

To a 90% phosphoric acid prepared by a procedure similar to that of Example 1, 2.00 wt % of 3-aminopropyltrimethoxysilane (manufactured by Shin-Etsu Chemical Co., Ltd.) and 1.00 wt % of succinic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 300 ppm, to obtain an etching solution composition of Example 11, which thus originally contained silicon nitride.

Example 12

To a 90% phosphoric acid prepared by a procedure similar to that of Example 1, 4.00 wt % of 3-aminopropyltrimethoxysilane (manufactured by Shin-Etsu Chemical Co., Ltd.) and 0.40 wt % of adipic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 12, which thus originally contained silicon nitride.

Example 13

To an 86% phosphoric acid prepared by a procedure similar to that of Example 5, 10.00 wt % of 3-aminopropyltrimethoxysilane (manufactured by Shin-Etsu Chemical Co., Ltd.) and 1.00 wt % of adipic acid dihydrazide (manufactured by Fujifilm Wako Pure Chemical Corporation) were added and dissolved. A predetermined amount of silicon nitride was dissolved in the solution so that the concentration of Si derived from silicon nitride in the solution was adjusted to 1000 ppm, to obtain an etching solution composition of Example 13, which thus originally contained silicon nitride.

Comparative Example 1

To a 90% phosphoric acid prepared by a procedure similar to that of Example 1, 0.01 wt % of N-2-(aminoethyl)-3-aminopropyltrimethoxysilane (manufactured by Shin-Etsu Chemical Co., Ltd.) was added and dissolved to obtain an etching solution composition of Comparative Example 1.

Comparative Example 2

To a 90% phosphoric acid prepared by a procedure similar to that of Example 1, 0.10 wt % of N-2-(aminoethyl)-3-aminopropyltrimethoxysilane (manufactured by Shin-Etsu Chemical Co., Ltd.) was added and dissolved to obtain an etching solution composition of Comparative Example 2.

Comparative Example 3

To a 90% phosphoric acid prepared by a procedure similar to that of Example 1, 1.00 wt % of N-2-(aminoethyl)-3- aminopropyltrimethoxysilane (manufactured by Shin-Etsu Chemical Co., Ltd.) was added and dissolved to obtain an etching solution composition of Comparative Example 3.

Comparative Example 4

To a 90% phosphoric acid prepared by a procedure similar to that of Example 1, 4.00 wt % of N-2-(aminoethyl)-3-aminopropyltrimethoxysilane (manufactured by Shin-Etsu Chemical Co., Ltd.) was added and dissolved. A predetermined amount of silicon nitride was dissolved in the solution so that the concentration of Si derived from silicon nitride in the solution was adjusted to 500 ppm, to obtain an etching solution composition of Comparative Example 4, which thus originally contained silicon nitride.

Comparative Example 5

To a 90% phosphoric acid prepared by a procedure similar to that of Example 1, 4.00 wt % of 3-aminopropyltrimethoxysilane (manufactured by Shin-Etsu Chemical Co., Ltd.) was added and dissolved. A predetermined amount of silicon nitride was dissolved in the solution so that the concentration of Si derived from silicon nitride in the solution was adjusted to 500 ppm, to obtain an etching solution composition of Comparative Example 5, which thus originally contained silicon nitride.

Comparative Example 6

To a 90% phosphoric acid prepared by a procedure similar to that of Example 1, 0.10 wt % of adipic acid dihydrazide (manufactured by Fujifilm Wako Pure Chemical Corporation) was added and dissolved to obtain an etching solution composition of Comparative Example 6.

Comparative Example 7

To a 90% phosphoric acid prepared by a procedure similar to that of Example 1, 1.00 wt % of adipic acid dihydrazide (manufactured by Fujifilm Wako Pure Chemical Corporation) was added and dissolved to obtain an etching solution composition of Comparative Example 7.

Comparative Example 8

To a 90% phosphoric acid prepared by a procedure similar to that of Example 1, 0.01 wt % of adipic acid dihydrazide (manufactured by Fujifilm Wako Pure Chemical Corporation) was added and dissolved. A predetermined amount of silicon nitride was dissolved in the solution so that the concentration of Si derived from silicon nitride in the solution was adjusted to 200 ppm, to obtain an etching solution composition of Comparative Example 8, which thus originally contained silicon nitride.

Comparative Example 9

To a 90% phosphoric acid prepared by a procedure similar to that of Example 1, 0.10 wt % of adipic acid dihydrazide (manufactured by Fujifilm Wako Pure Chemical Corporation) was added and dissolved. A predetermined amount of silicon nitride was dissolved in the solution so that the concentration of Si derived from silicon nitride in the solution was adjusted to 200 ppm, to obtain an etching solution composition of Comparative Example 9, which thus originally contained silicon nitride.

Comparative Example 10

To a 90% phosphoric acid prepared by a procedure similar to that of Example 1, 1.00 wt % of succinic acid dihydrazide (manufactured by Fujifilm Wako Pure Chemical Corporation) was added and dissolved to obtain an etching solution composition of Comparative Example 10.

Comparative Example 11

A predetermined amount of silicon nitride was dissolved in the etching composition of Comparative Example 10 so that the concentration of Si derived from silicon nitride in the solution was adjusted to 200 ppm, to obtain an etching solution composition of Comparative Example 11, which thus originally contained silicon nitride.

Comparative Example 12

To a 90% phosphoric acid prepared by a procedure similar to that of Example 1, 1.00 wt % of acetohydrazide (manufactured by Fujifilm Wako Pure Chemical Corporation) was added and dissolved to obtain an etching solution composition of Comparative Example 12.

Comparative Example 13

A predetermined amount of silicon nitride was dissolved in the etching composition of Comparative Example 12 so that the concentration of Si derived from silicon nitride in the solution was adjusted to 200 ppm, to obtain an etching solution composition of Comparative Example 13, which thus originally contained silicon nitride.

Reference Example 1

A 90% phosphoric acid prepared by a procedure similar to that of Example 1 was directly used as an etching solution of Reference Example 1.

<Etch Test 1>

Next, test conditions, measuring methods, and the like in an etch test 1 that was conducted using the etching solution compositions of Examples 1 to 13 and Comparative Examples 1 to 13 and the etching solution of Reference Example 1 will be described.

[Test Conditions]

Testpieces of silicon nitride (silicon nitride films) and testpieces of silicon oxide (silicon oxide films), which were to be subjected to etching, were prepared. Each testpiece had a square shape with a size of 1.5 cm×1.5 cm. The etching process time (t) was 10 minutes for the silicon nitride film and 30 minutes for the silicon oxide film. When it was difficult to observe any effect, the etching process time was extended to 60 to 100 minutes as necessary. The etching process temperature was 165° C.

[Method for Measuring Concentration of Si Derived from Silicon Nitride]

The Si concentration [Si 1a] of an etching solution composition and the Si concentration [Si 1b] of the etching solution composition that was consumed, so that silicon nitride was dissolved in the solution, were measured. The concentration [Si 1] of Si derived from silicon nitride was calculated by:

$$[Si\ 1] = [Si\ 1b] - [Si\ 1a] \qquad (1)$$

Incidentally, the Si concentration [Si 1a] of an etching solution composition is derived from the etch inhibitor contained in the etching solution composition. It should be noted that the Si concentration of a solution was measured by ICP atomic emission spectrometry (ICP-AES) using a high-resolution ICP optical emission spectrometer (product name: "PS3520," manufactured by Hitachi High-Tech Science Corporation).

[Method for Measuring Etch Rate]

The thickness [$T_{1a}$] of a silicon nitride film before an etching process and the thickness [$T_{1b}$] of the silicon nitride film after the etching process were measured. The etch rate [$R_1$] was calculated by:

$$[R_1] = ([T_{1a}] - [T_{1b}])/t\ (10\ \text{minutes}) \qquad (2)$$

Likewise, the thickness [$T_{2a}$] of a silicon oxide film before an etching process and the thickness [$T_{2b}$] of the silicon oxide film after the etching process were measured. The etch rate [$R_2$] of silicon oxide was calculated by:

$$[R_2] = ([T_{2a}] - [T_{2b}])/t\ (30\ \text{minutes or }60\ \text{to }100\ \text{minutes}) \qquad (3)$$

The ratio of the silicon nitride etch rate [$R_1$] to the silicon oxide etch rate [$R_2$] is referred to as a selectivity ratio [$R_1/R_2$], which is an indicator for the etch selectivity of silicon nitride. It should be noted that the thickness was measured using a light interference thickness monitor (product name: "Ava Thinfilm," manufactured by Avantes).

[Silica Deposition Assessment of Surface of Silicon Oxide Film]

The difference ([$T_{2a}$]–[$T_{2b}$]) between the thickness [$T_{2a}$] of a silicon oxide film before an etching process and the thickness [$T_{2b}$] of the silicon oxide film after the etching process is calculated. If the thickness after the etching process increases (the difference has a negative value), it can be determined that silica is deposited on the surface of silicon oxide.

The specifications of the etching solution compositions of Examples 1 to 13, the specifications of the etching solution compositions of Comparative Examples 1 to 13, and the specifications of the etching solution of Reference Example 1, and the results of the etch test 1 conducted using the etching solution compositions and the etching solution, are shown together on Table 1 below.

TABLE 1

| | Etching solution composition (wt %) | | |
| --- | --- | --- | --- |
| | Inorgnic acid | Etch inhibitor | Deposition inhibitor |
| Example 1 | Phosphoric acid 90 | N-2-(aminoethyl)-3-aminopropyltrimethoxysilane 1.00 | Adipic acid dihydrazide 0.10 |
| Example 2 | Phosphoric acid 90 | N-2-(aminoethyl)-3-aminopropyltrimethoxysilane 1.00 | Adipic acid dihydrazide 0.10 |
| Example 3 | Phosphoric acid 90 | N-2-(aminoethyl)-3-aminopropyltrimethoxysilane 1.00 | Adipic acid dihydrazide 0.10 |
| Example 4 | Phosphoric acid 90 | N-2-(aminoethyl)-3-aminopropyltrimethoxysilane 1.00 | Adipic acid dihydrazide 0.10 |
| Example 5 | Phosphoric acid 86 | N-2-(aminoethyl)-3-aminopropyltrimethoxysilane 10.00 | Adipic acid dihydrazide 1.00 |
| Example 6 | Phosphoric acid 90 | N-2-(aminoethyl)-3-aminopropyltrimethoxysilane 1.00 | Dodecanedioic acid dihydrazide 0.10 |
| Example 7 | Phosphoric acid 90 | Dimethyldimethoxysilane 1.00 | Adipic acid dihydrazide 0.10 |
| Example 8 | Phosphoric acid 90 | Dimethyldimethoxysilane 1.00 | Adipic acid dihydrazide 0.10 |
| Example 9 | Phosphoric acid 90 | 3-aminopropyltrimethoxysilane 1.00 | Adipic acid dihydrazide 0.10 |
| Example 10 | Phosphoric acid 90 | 3-aminopropyltrimethoxysilane 1.00 | Acetohydrazide 1.00 |
| Example 11 | Phosphoric acid 90 | 3-aminopropyltrimethoxysilane 2.00 | Succinic acid dihydrazide 1.00 |
| Example 12 | Phosphoric acid 90 | 3-aminopropyltrimethoxysilane 4.00 | Adipic acid dihydrazide 0.40 |
| Example 13 | Phosphoric acid 86 | 3-aminopropyltrimethoxysilane 10.00 | Adipic acid dihydrazide 1.00 |
| Comparative Example 1 | Phosphoric acid 90 | N-2-(aminoethyl)-3-aminopropyltrimethoxysilane 0.01 | — |
| Comparative Example 2 | Phosphoric acid 90 | N-2-(aminoethyl)-3-aminopropyltrimethoxysilane 0.10 | — |
| Comparative Example 3 | Phosphoric acid 90 | N-2-(aminoethyl)-3-aminopropyltrimethoxysilane 1.00 | — |
| Comparative Example 4 | Phosphoric acid 90 | N-2-(aminoethyl)-3-aminopropyltrimethoxysilane 4.00 | — |
| Comparative Example 5 | Phosphoric acid 90 | 3-aminopropyltrimethoxysilane 4.00 | — |
| Comparative Example 6 | Phosphoric acid 90 | — | Adipic acid dihydrazide 0.10 |
| Comparative Example 7 | Phosphoric acid 90 | — | Adipic acid dihydrazide 1.00 |
| Comparative Example 8 | Phosphoric acid 90 | — | Adipic acid dihydrazide 0.01 |
| Comparative Example 9 | Phosphoric acid 90 | — | Adipic acid dihydrazide 0.10 |
| Comparative Example 10 | Phosphoric acid 90 | — | Succinic acid dihydrazide 1.00 |
| Comparative Example 11 | Phosphoric acid 90 | — | Succinic acid dihydrazide 1.00 |
| Comparative Example 12 | Phosphoric acid 90 | — | Acetohydrazide 1.00 |
| Comparative Example 13 | Phosphoric acid 90 | — | Acetohydrazide 1.00 |
| Reference Example 1 | Phosphoric acid 90 | — | — |

| | SiN-derived Si concentration (ppm) | SiN etch rate [$R_1$] (nm/min) | SiO etch rate [$R_2$] (nm/min) | Selectivity ratio [$R_1/R_2$] | SiO film thickness difference (nm) |
| --- | --- | --- | --- | --- | --- |
| Example 1 | 0 | 4.97 | 0.03 | 166 | 0.9 |
| Example 2 | 40 | 4.81 | 0.02 | 253 | 1.9 |
| Example 3 | 80 | 4.68 | 0.00 | ∞ | 0 |
| Example 4 | 200 | 4.77 | 0.00 | ∞ | 0 |
| Example 5 | 1000 | 3.55 | 0.00 | ∞ | 0 |
| Example 6 | 200 | 4.45 | 0.00 | ∞ | 0 |
| Example 7 | 0 | 5.00 | 0.08 | 63 | 2.4 |
| Example 8 | 180 | 4.20 | 0.00 | ∞ | 0 |

TABLE 1-continued

| | | | | | |
|---|---|---|---|---|---|
| Example 9 | 200 | 4.63 | 0.00 | ∞ | 0 |
| Example 10 | 400 | 4.70 | 0.00 | ∞ | 0 |
| Example 11 | 300 | 4.45 | 0.00 | ∞ | 0 |
| Example 12 | 500 | 3.89 | 0.00 | ∞ | 0 |
| Example 13 | 1000 | 3.20 | 0.00 | ∞ | 0 |
| Comparative Example 1 | 0 | 5.54 | 0.19 | 29 | 5.7 |
| Comparative Example 2 | 0 | 5.69 | 0.16 | 36 | 4.8 |
| Comparative Example 3 | 0 | 5.64 | 0.11 | 51 | 3.3 |
| Comparative Example 4 | 500 | 4.44 | −0.02 | −222 | −1.2 |
| Comparative Example 5 | 500 | 3.85 | −0.02 | −193 | −1.0 |
| Comparative Example 6 | 0 | 5.94 | 0.22 | 27 | 6.7 |
| Comparative Example 7 | 0 | 5.72 | 0.22 | 26 | 6.6 |
| Comparative Example 8 | 200 | 4.95 | −0.19 | −26 | −5.7 |
| Comparative Example 9 | 200 | 4.42 | −0.30 | −15 | −9.1 |
| Comparative Example 10 | 0 | 5.63 | 0.23 | 24 | 3.7 |
| Comparative Example 11 | 200 | 4.72 | −0.02 | −277 | −1.1 |
| Comparative Example 12 | 0 | 6.13 | 0.24 | 26 | 7.2 |
| Comparative Example 13 | 200 | 5.56 | −0.02 | −278 | −1.1 |
| Reference Example 1 | 0 | 5.90 | 0.22 | 27 | 6.6 |

<Discussion 1>

As a result of the etch test 1, there are the following new findings on the etching solution composition of the present invention.

[1] The etching solution compositions of Examples 1 to 6, which are based on phosphoric acid (inorganic acid) and contain N-2-(aminoethyl)-3-aminopropyltrimethoxysilane (etch inhibitor) and adipic acid dihydrazide or dodecanedioic acid dihydrazide (deposition inhibitor), the etching solution compositions of Examples 7 and 8, which are based on phosphoric acid (inorganic acid) and contain dimethyl-dimethoxysilane (etch inhibitor) and adipic acid dihydrazide (deposition inhibitor), and the etching solution compositions of Examples 9 to 13, which are based on phosphoric acid (inorganic acid) and contain 3-aminopropyltrimethoxysilane (etch inhibitor) and adipic acid dihydrazide, acetohydrazide, or succinic acid dihydrazide (deposition inhibitor), can have a reduced silicon oxide etch rate [$R_2$], resulting in an increased etch selectivity of the silicon nitride film, and therefore, a higher selectivity ratio [$R_1/R_2$]. In the case in which Si derived from silicon nitride was not contained in the solution for comparison, the selectivity ratio [$R_1/R_2$] of the etching solution composition of the present invention (Example 1) was at least six times as high as the selectivity ratio of the etching solution (Reference Example 1) containing only phosphoric acid (inorganic acid). In addition, it was observed that the value of the selectivity ratio [$R_1/R_2$] tends to increase with an increase in the concentration of Si derived from silicon nitride in the solution. In addition, for the etching solution compositions of Examples 1 to 13, the deposition of Si on the surface of silicon oxide was reliably reduced. In particular, for the etching solution compositions of Examples 5 and 13, in which the concentration of Si derived from silicon nitride in the solution was as high as 1000 ppm, the deposition of silica on the surface of silicon oxide was not observed.

[2] Concerning the etching solution compositions of Comparative Examples 1 to 5, which are based on phosphoric acid (inorganic acid) and contain N-2-(aminoethyl)-3-aminopropyltrimethoxysilane or 3-aminopropyltrimethoxysilane (etch inhibitor) and do not contain a deposition inhibitor, the etching solution compositions of Comparative Examples 1 to 3, which do not contain Si derived from silicon nitride in the solution, did not have a sufficiently high selectivity ratio [$R_1/R_2$] irrespective of the contained amount of the etch inhibitor. In addition, excessive etching on silicon oxide was observed, and therefore, it was difficult to perform fine etching. In contrast, the etching solution compositions of Comparative Examples 4 and 5, in which the concentration of Si derived from silicon nitride in the solution was 500 ppm, had a negative silicon oxide etch rate [$R_2$], i.e., the deposition of silica on the surface of silicon oxide was observed.

[3] Concerning the etching solution compositions of Comparative Examples 6-13, which are based on phosphoric acid (inorganic acid) and contain adipic acid dihydrazide, succinic acid dihydrazide, or acetohydrazide (deposition inhibitor) and do not contain an etch inhibitor, the etching solution compositions of Comparative Examples 6, 7, 10, and 12, which do not contain Si derived from silicon nitride in the solution, did not have a sufficiently high selectivity ratio [$R_1/R_2$]. In addition, excessive etching on silicon oxide was observed, and therefore, it was difficult to perform fine etching. In contrast, the etching solution compositions of Comparative Examples 8, 9, 11, and 13, in which the concentration of Si derived from silicon nitride in the solution was 200 ppm, had a negative silicon oxide etch rate [$R_2$], i.e., the deposition of silica on the surface of silicon oxide was observed.

[4] The above results demonstrate that the etching solution compositions of Examples 1 to 13 (the present invention), which contain both an etch inhibitor and a deposition inhibitor, can have both a higher etch selectivity of silicon nitride and a reduction in the deposition of silica on the surface of silicon oxide.

Incidentally, for etching solution compositions, in order to increase the selectivity ratio [$R_1/R_2$], it is effective to reduce the silicon oxide etch rate [$R_2$] as shown by the result of the etch test 1. Practically, it is necessary to increase the silicon nitride etch rate [$R_1$]. However, [$R_1$] tends to decrease with an increase in the concentration of Si derived from silicon nitride in the solution (i.e., the solution is consumed and becomes less effective). The present inventors' further study has newly found that when two deposition inhibitors (a first deposition inhibitor and a second deposition inhibitor) are used, [$R_1$] can be maintained high even when the concentration of Si derived from silicon nitride in the solution is high, and therefore, the problem that the solution is consumed and becomes less effective can be solved (the life of the solution can be extended). Examples of the etching solution composition of the present invention that contains two deposition inhibitors will be described below.

<Formulation 2 of Etching Solution Compositions>

As the etching solution composition of the present invention, etching solution compositions of Examples 14 to 23 each containing an etch inhibitor and two deposition inhibitors were formulated. Although in Examples 14 to 23, in order to compare with the results of the etch test 1, combinations of the hydrazides (first deposition inhibitor) used in the etch test 1 and other deposition inhibitors (second deposition inhibitor) were studied as the two deposition inhibitors, the present invention is not limited to these combinations. Methods for formulating the etching solution compositions and an etching solution will be described below.

Example 14

To a 90% phosphoric acid prepared by a procedure similar to that of Example 1, 1.00 wt % of 3-aminopropyltrimethoxysilane (manufactured by Shin-Etsu Chemical Co., Ltd.), 0.20 wt % of adipic acid dihydrazide (manufactured by Fujifilm Wako Pure Chemical Corporation), and 0.10 wt % of imidazole (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 14, which thus originally contained silicon nitride.

Example 15

To a 90% phosphoric acid prepared by a procedure similar to that of Example 1, 2.00 wt % of N-2-(aminoethyl)-3-aminopropyltrimethoxysilane (manufactured by Shin-Etsu Chemical Co., Ltd.), 0.20 wt % of succinic acid dihydrazide (manufactured by Fujifilm Wako Pure Chemical Corporation), and 0.20 wt % of imidazole (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 15, which thus originally contained silicon nitride.

Example 16

To a 90% phosphoric acid prepared by a procedure similar to that of Example 1, 1.00 wt % of 3-aminopropyltrimethoxysilane (manufactured by Shin-Etsu Chemical Co., Ltd.), 0.20 wt % of adipic acid dihydrazide (manufactured by Fujifilm Wako Pure Chemical Corporation), and 0.10 wt % of 1-butyl-3-methylimidazolium chloride (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 16, which thus originally contained silicon nitride.

Example 17

To a 90% phosphoric acid prepared by a procedure similar to that of Example 1, 2.00 wt % of N-2-(aminoethyl)-3-aminopropyltrimethoxysilane (manufactured by Shin-Etsu Chemical Co., Ltd.), 0.20 wt % of acetohydrazide (manufactured by Fujifilm Wako Pure Chemical Corporation), and 0.20 wt % of 1-butyl-3-methylimidazolium chloride (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 17, which thus originally contained silicon nitride.

Example 18

To a 90% phosphoric acid prepared by a procedure similar to that of Example 1, 2.00 wt % of 3-aminopropyltrimethoxysilane (manufactured by Shin-Etsu Chemical Co., Ltd.), 0.30 wt % of adipic acid dihydrazide (manufactured by Fujifilm Wako Pure Chemical Corporation), and 0.20 wt % of 1-ethyl-3-methylimidazolium hexafluorophosphate (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 18, which thus originally contained silicon nitride.

Example 19

To a 90% phosphoric acid prepared by a procedure similar to that of Example 1, 2.00 wt % of 3-aminopropyltrimethoxysilane (manufactured by Shin-Etsu Chemical Co., Ltd.), 0.30 wt % of adipic acid dihydrazide (manufactured by Fujifilm Wako Pure Chemical Corporation), and 0.20 wt % of 1-ethyl-3-octylimidazolium tetrafluoroborate (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 19, which thus originally contained silicon nitride.

Example 20

To a 90% phosphoric acid prepared by a procedure similar to that of Example 1, 2.00 wt % of 3-aminopropyltrimethoxysilane (manufactured by Shin-Etsu Chemical Co., Ltd.), 0.20 wt % of adipic acid dihydrazide (manufactured by Fujifilm Wako Pure Chemical Corporation), and 0.10 wt % of tetrabutylphosphonium bromide (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 20, which thus originally contained silicon nitride.

Example 21

To a 90% phosphoric acid prepared by a procedure similar to that of Example 1, 2.00 wt % of 3-aminopropyltrimethoxysilane (manufactured by Shin-Etsu Chemical Co., Ltd.), 0.20 wt % of adipic acid dihydrazide (manufactured by Fujifilm Wako Pure Chemical Corporation), and 0.20 wt % of 1-butyl-1-methylpyrrolidinium hexafluorophosphate (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 21, which thus originally contained silicon nitride.

Example 22

To a 90% phosphoric acid prepared by a procedure similar to that of Example 1, 2.00 wt % of 3-aminopropyltrimethoxysilane (manufactured by Shin-Etsu Chemical Co., Ltd.), 0.30 wt % of adipic acid dihydrazide (manufactured by Fujifilm Wako Pure Chemical Corporation), and 0.20 wt % of 1-butyl-1-methylpyrrolidinium tetrafluoroborate (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 22, which thus originally contained silicon nitride.

Example 23

To a 90% phosphoric acid prepared by a procedure similar to that of Example 1, 2.00 wt % of N-2-(aminoethyl)-3- aminopropyltrimethoxysilane (manufactured by Shin-Etsu Chemical Co., Ltd.), 0.20 wt % of adipic acid dihydrazide (manufactured by Fujifilm Wako Pure Chemical Corporation), and 0.20 wt % of tetramethylammonium hexafluorophosphate (manufactured by Fujifilm Wako Pure Chemical Corporation) were added and dissolved. A predetermined amount of silicon nitride was dissolved in the solution so that the concentration of Si derived from silicon nitride in the solution was adjusted to 500 ppm, to obtain an etching solution composition of Example 23, which thus originally contained silicon nitride.

<Etch Test 2>

Next, an etch test 2 was conducted using the etching solutions of Examples 14 to 23. Test conditions, measuring methods, and the like in the etch test 2 are the same as those in the etch test 1 described above.

The specifications of the etching solution compositions of Examples 14 to 23, and the results of the etch test 2 conducted using the etching solution compositions, are shown together on Table 2 below.

TABLE 2

| | Etching solution composition (wt %) | | |
| --- | --- | --- | --- |
| | Inorgnic acid | Etch inhibitor | Deposition inhibitor |
| Example 14 | Phosphoric acid 90 | 3-aminopropyltrimethoxysilane 1.00 | Adipic acid dihydrazide 0.20 Imidazole 0.10 |
| Example 15 | Phosphoric acid 90 | N-2-(aminoethyl)-3-aminopropyltrimethoxysilane 2.00 | Succinic acid dihydrazide 0.20 Imidazole 0.20 |
| Example 16 | Phosphoric acid 90 | 3-aminopropyltrimethoxysilane 1.00 | Adipic acid dihydrazide 0.20 1-butyl-3-methylimidazolium chloride 0.10 |
| Example 17 | Phosphoric acid 90 | N-2-(aminoethyl)-3-aminopropyltrimethoxysilane 2.00 | Acetohydrazide 0.20 1-butyl-3-methylimidazolium chloride 0.20 |
| Example 18 | Phosphoric acid 90 | 3-aminopropyltrimethoxysilane 2.00 | Adipic acid dihydrazide 0.30 1-ethyl-3-methylimidazolium hexafluorophosphate 0.20 |
| Example 19 | Phosphoric acid 90 | 3-aminopropyltrimethoxysilane 2.00 | Adipic acid dihydrazide 0.30 1-ethyl-3-octylimidazolium tetrafluoroborate 0.20 |
| Example 20 | Phosphoric acid 90 | 3-aminopropyltrimethoxysilane 2.00 | Adipic acid dihydrazide 0.20 Tetrabutylphosphonium bromide 0.10 |
| Example 21 | Phosphoric acid 90 | 3-aminopropyltrimethoxysilane 2.00 | Adipic acid dihydrazide 0.20 1-butyl-1-methylpyrrolidinium hexafluorophosphate 0.20 |
| Example 22 | Phosphoric acid 90 | 3-aminopropyltrimethoxysilane 2.00 | Adipic acid dihydrazide 0.30 1-butyl-1-methylpyrrolidinium tetrafluoroborate 0.20 |
| Example 23 | Phosphoric acid 90 | N-2-(aminoethyl)-3-aminopropyltrimethoxysilane 2.00 | Adipic acid dihydrazide 0.20 Tetramethylammonium hexafluorophosphate 0.20 |

| | SiN-derived Si concentration (ppm) | SiN etch rate $[R_1]$ (nm/min) | SiO etch rate $[R_2]$ (nm/min) | Selectivity ratio $[R_1/R_2]$ | SiO film thickness difference (nm) |
| --- | --- | --- | --- | --- | --- |
| Example 14 | 500 | 4.49 | 0.00 | ∞ | 0 |
| Example 15 | 500 | 3.99 | 0.00 | ∞ | 0 |
| Example 16 | 500 | 4.40 | 0.00 | ∞ | 0 |
| Example 17 | 500 | 4.30 | 0.00 | ∞ | 0 |
| Example 18 | 500 | 8.14 | 0.00 | ∞ | 0 |
| Example 19 | 500 | 7.83 | 0.00 | ∞ | 0 |
| Example 20 | 500 | 3.64 | 0.00 | ∞ | 0 |
| Example 21 | 500 | 8.62 | 0.00 | ∞ | 0 |
| Example 22 | 500 | 6.85 | 0.00 | ∞ | 0 |
| Example 23 | 500 | 10.24 | 0.00 | ∞ | 0 |

<Discussion 2>

As a result of the etch test 2, there are the following new findings on the etching solution composition of the present invention.

[5] The etching solution compositions of Examples 14 to 23, which are based on phosphoric acid (inorganic acid) and contain 3-aminopropyltrimethoxysilane or N-2-(amino-ethyl)-3-aminopropyltrimethoxysilane (etch inhibitor), and two deposition inhibitors, can have a reduced silicon oxide etch rate [$R_2$] and maintain the silicon nitride etch rate [$R_1$] high even when 500 ppm of Si derived from silicon nitride is contained in the solution, resulting in a higher selectivity ratio [$R_1/R_2$].

[6] In particular, the etching solution compositions of Examples 18, 19, and 21 to 23, which contain a fluorine-containing group (fluoro-) as one of the two deposition inhibitors, has a particularly high silicon nitride etch rate [$R_1$], contributing to a greater longevity of the solution.

[7] The etching solution compositions of Examples 14 to 23, which contain an etch inhibitor and two deposition inhibitors, contain a reduced amount of the etch inhibitor, and thereby, can have an increased silicon nitride etch rate [$R_1$], compared to the result of the etch test 1, which leads, together with the greater longevity of the solution, to a significant reduction in cost, and therefore, is considerably useful.

INDUSTRIAL APPLICABILITY

The etching solution composition of the present invention is particularly useful for industrial manufacture of NAND type flash memory having a three-dimensional structure (3D NAND), and is also applicable to industrial manufacture of conventional memory having a two-dimensional structure.

What is claimed is:

1. An inorganic acid-based etching solution composition for selectively etching away silicon nitride from a semiconductor containing silicon nitride and silicon oxide, the etching solution composition comprising:

(a) an etch inhibitor that reduces etching of silicon oxide; and (b) a deposition inhibitor that reduces deposition of silica on a surface of silicon oxide, wherein the etch inhibitor contains an alkoxysilane or a silane coupling agent, and the deposition inhibitor contains a hydrazide.

2. The etching solution composition according to claim 1, wherein the alkoxysilane includes dimethyldimethoxysilane, and the silane coupling agent includes N-2-(aminoethyl)-3-aminopropyltrimethoxysilane or 3-aminopropyltrimethoxysilane.

3. The etching solution composition according to claim 1, wherein the hydrazide includes adipic acid dihydrazide, acetohydrazide, succinic acid dihydrazide, or dodecanedioic acid dihydrazide.

4. The etching solution composition according to claim 1, wherein the deposition inhibitor further includes a compound having an imidazole backbone, a compound having a pyrrolidine backbone, a phosphonic acid compound, or a compound having a quaternary ammonium backbone.

5. The etching solution composition according to claim 4, wherein the compound having an imidazole backbone includes imidazole, 1-butyl-3-methylimidazolium chloride, 1-ethyl-3-methylimidazolium hexafluorophosphate, or 1-ethyl-3-octylimidazolium tetrafluoroborate, the compound having a pyrrolidine backbone includes 1-butyl-1-methylpyrrolidinium hexafluorophosphate or 1-butyl-1-methylpyrrolidinium tetrafluoroborate, the phosphonic acid compound includes tetrabutylphosphonium bromide, and the compound having a quaternary ammonium backbone includes tetramethylammonium hexafluorophosphate.

6. The etching solution composition according to claim 1, wherein the etching solution composition can be used until the concentration of Si derived from silicon nitride in the solution reaches 1000 ppm.

7. The etching solution composition according to claim 1, wherein a selectivity ratio [$R_1/R_2$] of a silicon nitride etch rate [$R_1$] to a silicon oxide etch rate [$R_2$] is at least two times as high as that of an etching solution containing only the inorganic acid.

* * * * *